(12) United States Patent
Fukuhara et al.

(10) Patent No.: US 7,446,853 B2
(45) Date of Patent: Nov. 4, 2008

(54) EXPOSURE METHOD, EXPOSURE TOOL AND METHOD OF MANUFACTURING A SEMICONDUCTOR DEVICE

(75) Inventors: Kazuya Fukuhara, Tokyo (JP); Shinichi Ito, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 441 days.

(21) Appl. No.: 11/249,712

(22) Filed: Oct. 14, 2005

(65) Prior Publication Data

US 2006/0082747 A1 Apr. 20, 2006

(30) Foreign Application Priority Data

Oct. 15, 2004 (JP) .............................. 2004-301748

(51) Int. Cl.
G03B 27/42 (2006.01)
G03B 27/52 (2006.01)

(52) U.S. Cl. .......................................... 355/53; 355/30

(58) Field of Classification Search ................... 355/30, 355/52, 53, 55, 67, 77; 356/399–401; 250/548
See application file for complete search history.

(56) References Cited

U.S. PATENT DOCUMENTS 6,342,942 B1 * 1/2002 Uzawa .......................... 355/53

| | | | |
|---|---|---|---|
| 6,952,253 B2 | 10/2005 | Lof et al. | |
| 2004/0160582 A1 | 8/2004 | Lof et al. | |
| 2004/0165159 A1 | 8/2004 | Lof et al. | |

FOREIGN PATENT DOCUMENTS

| JP | 2003-100626 | 4/2003 |
|---|---|---|
| JP | 2005-072132 | 3/2005 |
| WO | WO 99/49504 | 9/1999 |

* cited by examiner

*Primary Examiner*—Hung Henry Nguyen
(74) *Attorney, Agent, or Firm*—Finnegan, Henderson, Farabow, Garrett & Dunner, L.L.P.

(57) ABSTRACT

An exposure method is disclosed, which includes forming on a substrate a resist film having first and second exposure fields arranged in a column direction, mounting the substrate on a scanning exposure tool in order to project a design pattern on the first and second exposure fields, forming a liquid immersion medium fluid film by using a liquid immersion medium fluid film forming unit, and projecting the design pattern onto the first or second exposure fields by varying an optical pattern image generated at the optical pattern image generating unit while moving the substrate in a direction in parallel with the column direction, wherein the projection of the design pattern onto the first and second exposure fields is continuously carried out without a change in a moving direction of the substrate and a direction of the flow of the liquid immersion medium fluid film.

9 Claims, 6 Drawing Sheets

FIG. 10

EXPOSURE METHOD, EXPOSURE TOOL AND METHOD OF MANUFACTURING A SEMICONDUCTOR DEVICE

CROSS-REFERENCE TO RELATED APPLICATIONS

This application is based upon and claims the benefit of priority from prior Japanese Patent Application No. 2004-301748, filed Oct. 15, 2004, the entire contents of which are incorporated herein by reference.

BACKGROUND OF THE INVENTION

1. Field of the Invention

The present invention relates to a lithography technology, and in particular, to an exposure method, an exposure tool which use a liquid immersion method, and a method of manufacturing a semiconductor device.

2. Description of the Related Art

In recent years, in order to cope with the miniaturization of semiconductor device patterns, a liquid immersion exposure tool in which exposure is carried out in a state in which a space between a projection lens and a to-be-substrate (hereinafter, substrate) is filled with a liquid immersion medium fluid (for example, water) has been developed (WO 99/46504). An exposure tool is made to be liquid immersion type, so that it is possible to improve a limit to a resolution without a change of an exposure wavelength, or to magnify a depth of focus. On the other hand, there are concerns that, a surface of a resist film is exposed to a liquid immersion medium fluid, whereby a substance is generated from the resist film due to hydrolysis or a photochemical reaction in the course of exposure, and the generated substance diffuses in the liquid immersion medium fluid, which scatters an exposure light, or contaminates a lens.

BRIEF SUMMARY OF THE INVENTION

According to one aspect of the present invention, there is provided an exposure method comprising:

forming on a substrate a resist film having first and second exposure fields arranged in a column direction;

mounting the substrate on a scanning exposure tool in order to project a design pattern on the first and second exposure fields, the exposure tool comprising an optical pattern image generating unit which generates an optical pattern image corresponding to a part of the design pattern, an optical projection unit which projects the optical pattern image onto an exposure slit region on the resist film which is smaller than the first and second exposure fields, a substrate stage which moves the substrate, and a liquid immersion medium fluid film forming unit which forms a liquid immersion medium fluid film having a flow between a local region on the resist film and the optical projection unit;

forming the liquid immersion medium fluid film by using the liquid immersion medium fluid film forming unit; and projecting the design pattern onto the first or second exposure fields by varying the optical pattern image generated at the optical pattern image generating unit while moving the substrate in a direction in parallel with the column direction, wherein the projection of the design pattern onto the first and second exposure fields is continuously carried out without a change in a moving direction of the substrate and a direction of the flow of the liquid immersion medium fluid film.

According to another aspect of the present invention, there is provided a method for manufacturing a semiconductor device, comprising, at the time of manufacturing a semiconductor device:

forming on a substrate a resist film having first and second exposure fields arranged in a column direction;

mounting the substrate on a scanning exposure tool in order to project a design pattern on the first and second exposure fields, the exposure tool comprising: an optical pattern image generating unit which generates an optical pattern image corresponding to a part of the design pattern; an optical projection unit which projects the optical pattern image onto an exposure slit region which is smaller than the first and second exposure fields; a substrate stage which moves the substrate; and a liquid immersion medium fluid film forming unit which forms a liquid immersion medium fluid film having a flow between a local region on the resist film and the optical projection unit;

forming the liquid immersion medium fluid film by using the liquid immersion medium fluid film forming unit; and projecting the design pattern onto the first or second exposure fields by varying the optical pattern image generated at the optical pattern image generating unit while moving the substrate in a direction in parallel with the column direction, the method further comprising:

projecting the design pattern onto the substrate by using the exposure method by which projection of the design pattern onto the first and second exposure fields is continuously carried out without a change in a moving direction of the substrate and a direction of the flow of the liquid immersion medium fluid film.

According to still another aspect of the present invention, there is provided a scan-and-step type exposure tool which projects a design pattern onto exposure fields on a resist film, the exposure tool comprising:

a substrate stage which moves a substrate having formed thereon a resist film in which first and second exposure fields are arranged in a column direction:

an optical pattern image generating unit which generates an optical pattern image corresponding to a part of the design pattern;

an optical projection unit which projects the optical pattern image onto an exposure slit region which is smaller than the first and second exposure fields of the resist film;

a liquid immersion medium fluid film forming unit which forms a liquid immersion medium fluid film having a flow between the exposure slit region on the resist film and the optical projection unit; and a control mechanism which controls the substrate stage, the optical pattern image generating unit, and the liquid immersion medium fluid film forming unit in order to control an order of projections of the design pattern onto the first and second exposure fields, a direction of the flow of the liquid immersion medium fluid film, and a moving direction of the substrate, the control mechanism controlling the substrate stage in order to successively project the design pattern onto the first and second exposure fields by successively moving the substrate in a direction in parallel with the column direction, and controlling the liquid immersion medium fluid film forming unit in order to maintain the flow of the liquid immersion medium fluid film in a given direction during a period from start of the projection of the design pattern onto the first exposure fields to termination of the projection of the design pattern onto the second exposure fields.

DETAILED DESCRIPTION OF THE INVENTION

An embodiment of the present invention will be described hereinafter with reference to the drawings.

Figure 1:
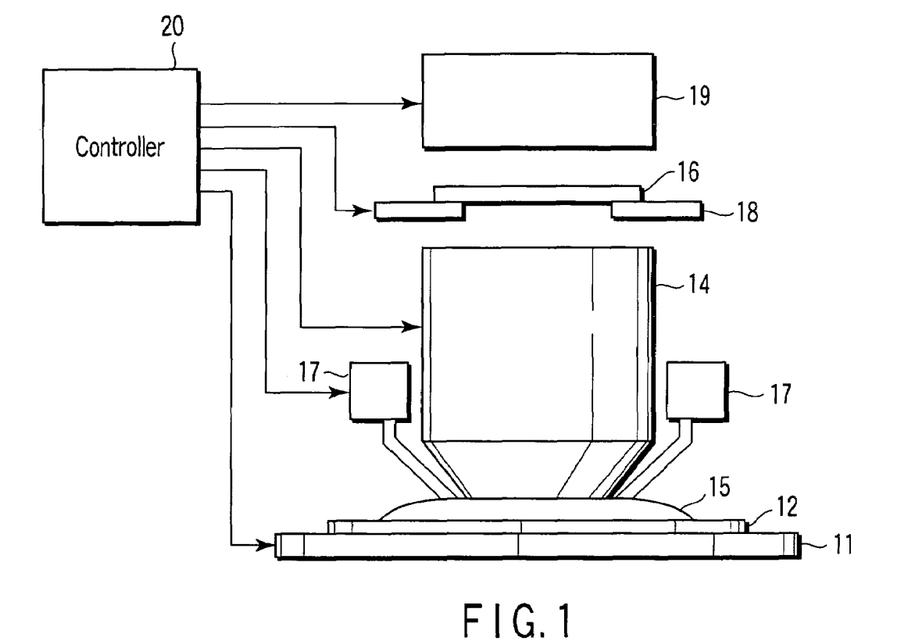
FIG. 1 is a diagram showing a configuration of a liquid immersion exposure tool according to an embodiment of the present invention.

FIG. 1 is a diagram showing a configuration of a liquid immersion exposure tool according to one embodiment of the invention. In FIG. 1, a substrate 12 having a photoresist film formed on a surface thereof is mounted on a substrate stage 11, and the substrate 12 is moved in accordance with a horizontal movement of the substrate stage 11. A photomask 16 having a design pattern (for example, a semiconductor device pattern) formed thereon is disposed on a horizontal mask stage 18. The photomask 16 is moved in accordance with a horizontal movement of the mask stage 18. This horizontal direction is a direction in parallel with an optical axis of an exposure light (which will be described later). An exposure light is emitted from an optical illumination system 19 to the photomask 16. A space between the substrate 12 and the projection lens 14 is filled with a liquid immersion medium fluid, for example, water 15. The exposure light which has been emitted from the optical illumination system 19, and has passed through the photomask 16 further permeates through the projection lens 14 and the layer of the liquid immersion medium fluid 15 to reach an exposure slit region. As a result, a latent image of a mask pattern is formed on the region of the photoresist film on the substrate 12 corresponding to the exposure slit region. A liquid immersion medium fluid supply and discharge device 17 is installed at the side of the projection lens 14. The liquid immersion medium fluid 15 is supplied and discharged between the substrate 12 and the projection lens 14 from the liquid immersion medium fluid supply and discharge device 17 in synchronism with scanning projection. A control circuit 20 controls operations of the substrate stage 11, the projection lens 14, the mask stage 18, the optical illumination system 19, the liquid immersion medium fluid supply and discharge device 17, etc.

Figure 2:
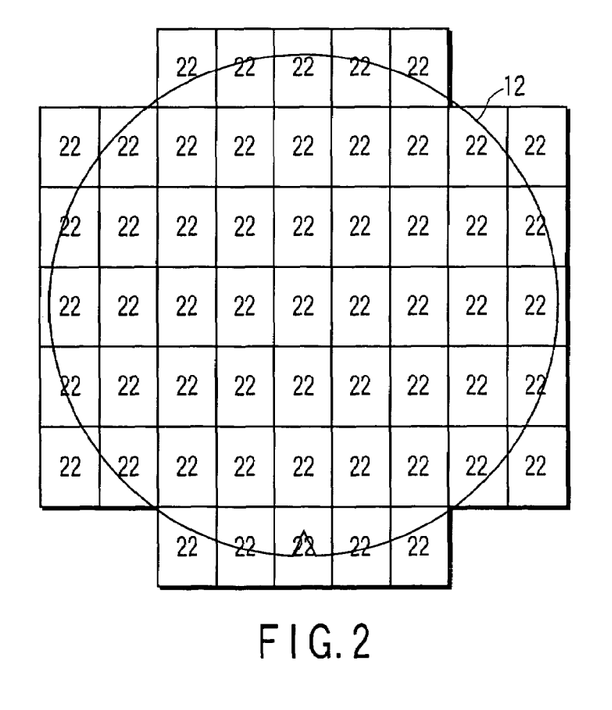
FIG. 2 is a diagram showing a layout of exposure fields formed on a substrate.
Figure 3A:
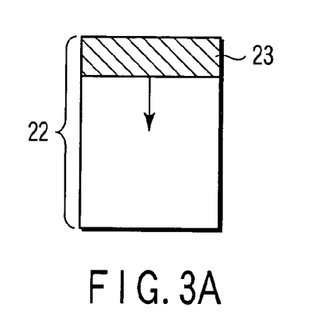
FIGS. 3A, 3B and 3C are diagrams for explanation of one mode of scanning projection.
Figure 3B:
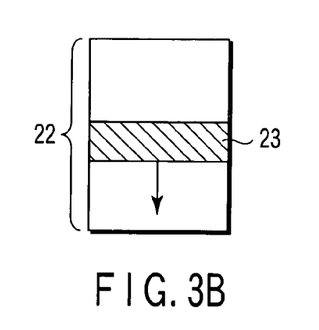
Figure 3C:
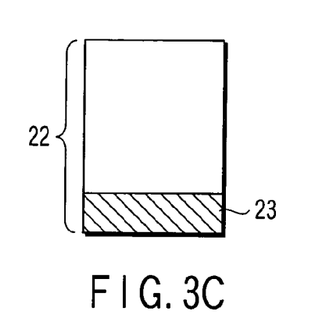
Figure 4A:
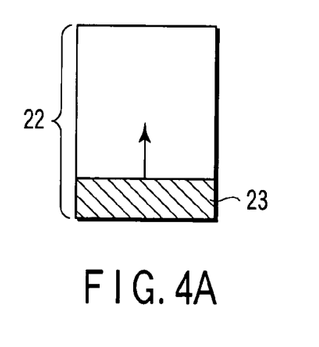
FIGS. 4A, 4B and 4C are diagrams for explanation of another mode of scanning projection.
Figure 4B:
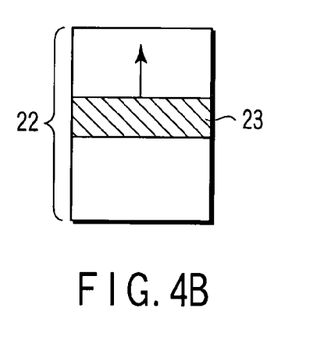
Figure 4C:
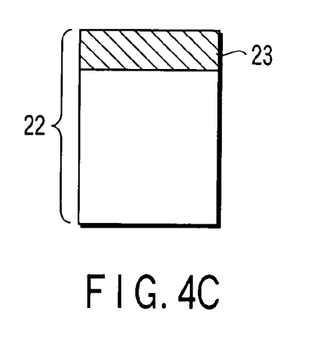

FIG. 2 shows a layout of rectangular exposure fields on the substrate. The mask pattern of the photomask is projected onto the exposure fields 22 by scanning projection. In this scanning projection, the exposure fields 22 are, for example, as shown in FIGS. 3A to 3C, scanned from the upper side to the lower side on a paper in units of an exposure slit region 23. Alternatively, as shown in FIGS. 4A to 4C, the exposure fields 22 are scanned from the lower side to the upper side on the paper.

Figure 5:
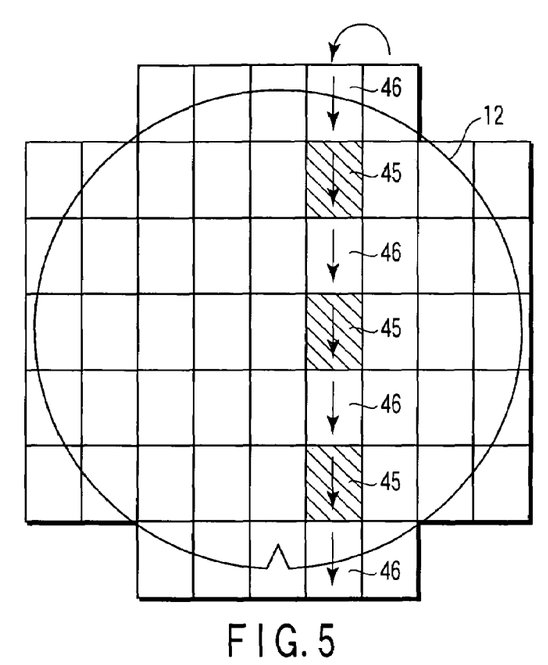
FIG. 5 is a diagram showing one mode of an exposure order at the time of exposing a projected image onto a substrate.
Figure 6:
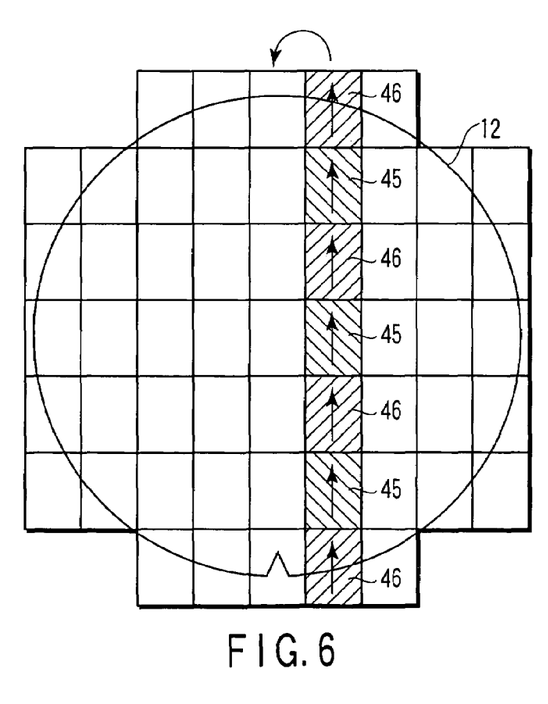
FIG. 6 is a diagram showing another mode of an exposure order at the time of exposing a projected image onto a substrate.

FIGS. 5 and 6 respectively show exposure orders when the mask pattern is sequentially scanning-projected with respect to a plurality of exposure fields on the substrate 12. In FIG. 5, first, the substrate stage 11 (FIG. 1) is horizontally moved in a given direction to thereby horizontally move the substrate 12 in the given direction, and projecting exposure is carried out a plurality of times during the movement in the given direction. At the time of this movement, with respect to the exposure fields on one line in the moving direction, projecting exposure is carried out onto alternate exposure fields 45. The substrate 12 is horizontally moved in the above-described given direction without a change in a direction at the time of this movement such that the substrate 12 is scanned from the top end to the bottom end in units of an exposure slit region. An exposure slit region is smaller than an exposure field. When the scanning reaches the bottom end of the substrate 12, the given direction is inverted, the substrate 12 is horizontally moved in the inverted direction, and projecting exposure is carried out a plurality of times during the movement. This projecting exposure is carried out with respect to alternate exposure fields 46 which have been unexposed, and consequently, as shown in FIG. 6, all exposure fields on one line are exposed. After the scanning projections shown in FIGS. 5 and 6, exposures are carried out in the orders of scanning shown in FIGS. 5 and 6 onto the adjacent columns on the substrate 12. Hereinafter, by carrying out similar scanning projections onto all the remaining lines, scanning projection is carried out onto all the exposure fields on the substrate 12.

Figure 7:
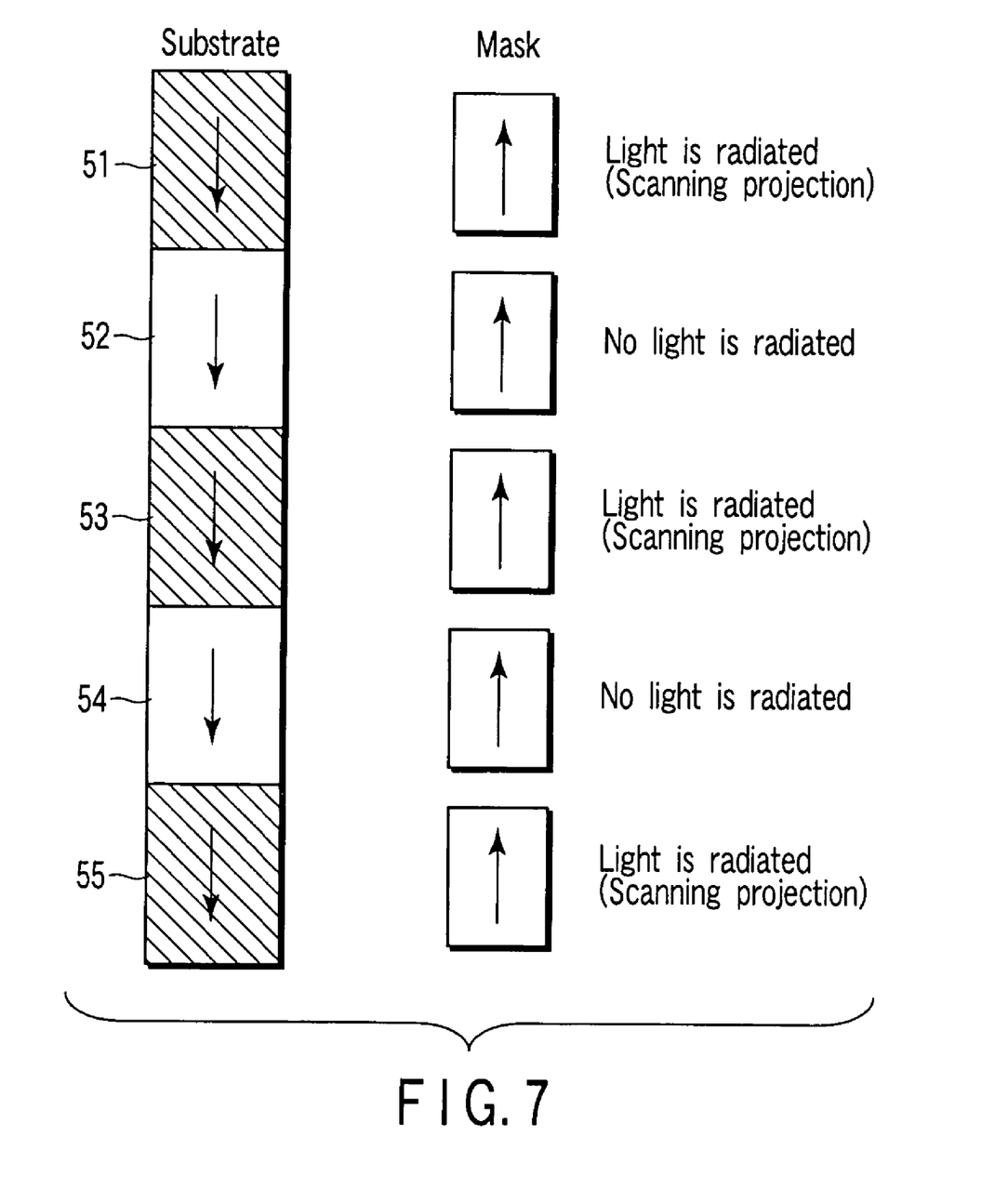
FIG. 7 is a diagram showing a situation of a horizontal movement of a photomask.

When scanning projection onto the substrate is carried out as shown in FIG. 5, a horizontal movement of the photomask is as in FIG. 7. First, when an exposure field 51 on the substrate is scanning-projected, the photomask is horizontally moved in a predetermined direction (first direction) with respect to the moving direction of the substrate while irradiating an exposure light thereon. Because a reverse image of the pattern of the photomask is projected on the substrate, the moving direction of the substrate and the moving direction of the photomask are generally opposite. While an exposure field 52 is moving under the projection lens 14 (FIG. 1) after the scanning projection onto the exposure field 51 is completed, the moving direction of the photomask is inverted, and the photomask is moved in a direction (second direction) opposite to the previous direction (first direction). At that time, a light irradiation is not carried out.

When an exposure field 53 approaches the exposure slit region, the photomask is horizontally moved in the same direction (first direction) at the time of scanning projection onto the exposure field 51, and scanning projection onto the exposure field 53 is carried out during the movement. While an exposure field 54 is moving under the projection lens 14 after the scanning projection onto the exposure field 53 is completed, the moving direction (first direction) of the photomask is inverted, and the photomask is moved in the opposite direction (second direction). At that time, a light irradiation is not carried out.

When an exposure field 55 approaches the exposure slit region, the photomask is horizontally moved in the same direction (first direction) at the time of scanning projections onto the exposure fields 51 and 53, and scanning projection onto the exposure field 55 is carried out during the movement.

As a result of the above-describe scanning projections, latent images are formed by irradiating an exposure light onto the exposure fields 51, 53, and 55 on the substrate, and no latent image is formed on the exposure fields 52 and 54. It is necessary for the photomask to return to a predetermined position until the exposure fields 52 and 54 complete the movements under the projection lens 14. Then, the movement speed of the substrate at the exposure fields 52 and 54 can be controlled by the control circuit 20 (FIG. 1) so as to correspond to a time required for the photomask returning to the predetermined position.

When a light is incident into the photoresist film existing on the substrate surface, substances (acid or the like) are generated in the resist film due to a photochemical reaction. These substances diffuse in a liquid immersion medium fluid which is filled in a space between the lens and the substrate, which varies the light permeance of water. An unwanted scattered light (a flare) occurs by this phenomenon so as to reach on the substrate, which deteriorates the resist pattern. In order to suppress such a deterioration of the resist pattern, the liquid immersion medium fluid which fills the space between the lens and the substrate is made to flow in a given direction, i.e., in the same direction as the moving direction of the substrate by supplying and discharging the liquid immersion medium fluid by means of the supply and discharge device during the scanning projection, so that diffused substances from the resist film are controlled so as not to accumulate in the liquid immersion medium fluid. In order to minimize the accumulation of diffused substances from the resist film in the liquid immersion medium fluid, a speed of the flow of the liquid immersion medium fluid is preferably made faster than the movement speed of the substrate. In a conventional exposure method, a scanning direction is inverted when the routine proceeds to scanning onto a next exposure field after scanning of one exposure field is completed. Because the direction of the flow of the liquid immersion medium fluid is changed, diffused substances are temporarily accumulated in the liquid immersion medium fluid. Therefore, a flare is generated in the above-described next exposure, which disturbs the resist pattern. Further, in some cases, micro-bubbles may be generated when the flow direction of the liquid immersion medium fluid is changed. Because micro-bubbles as well bring about a flare in the same way as diffused substances from the resist film, it is necessary to suppress the generation thereof. If inverting of a substrate moving direction and changing of a direction of a water flow are sufficiently carried out at a slow speed, accumulation of diffused substances and generation of micro-bubbles as described above are suppressed. However, there is the problem that a time required for an exposure process for a wafer is made longer.

In accordance with the technique shown in the present embodiment, the direction of scanning onto a plurality of, even though alternate, exposure fields is not changed. Therefore, a number of times of changing a flow direction of the liquid immersion medium fluid is made little, which makes a frequency of occurrence of problems as described above less. Consequently, the occurrence of a flare is suppressed, and the turbulence in the resist pattern is made less. Further, the movement speed of the substrate is made slow at the time of inverting the scanning direction. However, a number of times of inverting a scanning direction is made less in the present embodiment, and thus, a time required for a projecting exposure process is reduced.

Further, by making a speed that a region onto which exposure is not carried out passes through an exposure slit region be coincident with a time required for returning the photomask to an original position, a time required for an exposure process can be shortened. In this case, there are cases in which the movement speed of the substrate slightly varies. However, because the moving direction of the substrate is not changed, turbulence in the flow of the liquid immersion medium fluid is hardly brought about.

By using the exposure method described above, yield in a semiconductor device manufacturing process is improved. Further, throughput in semiconductor device manufacturing is improved. The exposure method described above is particularly effective for an KrF exposure tool whose exposure wavelength is 248 nm, an ArF exposure tool, whose exposure wavelength is 193 nm and an $F_2$ exposure tool whose exposure wavelength is 157 nm. In the case of the $F_2$ exposure tool, however, water is impenetrable to a light whose wavelength is 157 nm, and therefore, water cannot be used as a liquid immersion medium fluid, and for example, a perfluoro-polyether (PFPE) is used as a liquid immersion medium fluid.

MODIFIED EXAMPLE 1

Although a light permeable photomask is used in the exposure method in the above embodiment, the exposure method in the embodiment is available in a case of using another type of photomask having an equivalent function. Examples of such a photomask include a light reflective photomask, a liquid crystal mask having a function of electrically generating permeable/non-permeable patterns by using a liquid crystal panel and the like. An optical modulator having a function of generating light and dark patterns by controlling an angle of a mirror in accordance with an electrical signal by using an array of micro-mirrors may be used, instead (Reference Document: Jpn. Pat. Appln. KOKAI Publication No. 2003-100626). Because a pattern can be arbitrarily formed and eliminated in cases of using a liquid crystal mask and an optical modulator, there is no need to scan a pattern display mechanism itself, and a position at which the pattern is formed is changed in synchronism with a scan of the substrate. Further, because a process of returning the photomask to the original position is made unnecessary, unexposed regions such as the regions 52 and 54 in FIG. 7 are not generated even if an exposure without a change in a moving direction of the substrate is carried out. Thus, the effect of an improvement in throughput at an exposure process is greater than that in a case of using a photomask.

MODIFIED EXAMPLE 2

Figure 8A:
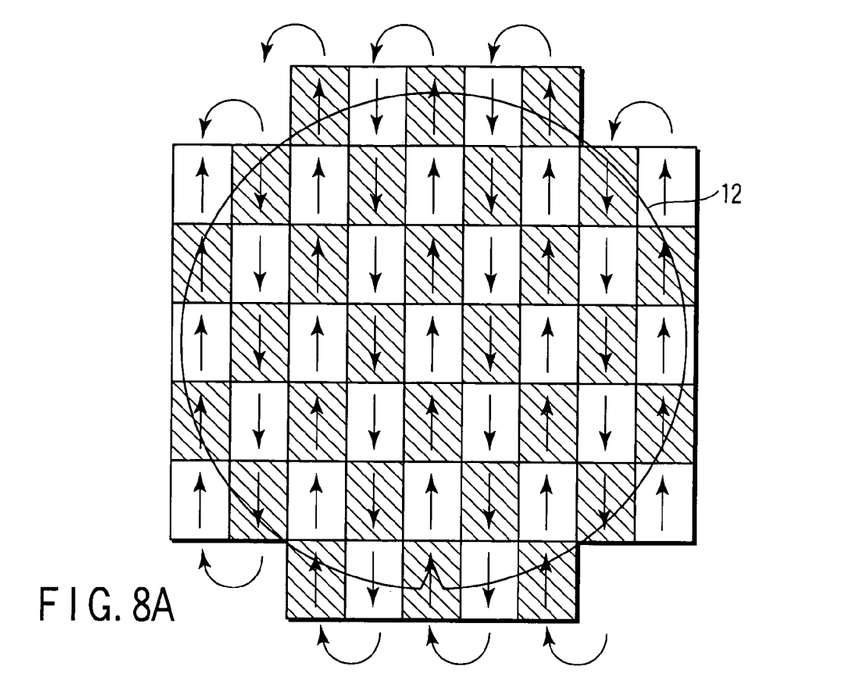
FIGS. 8A and 8B are diagrams showing other modes of exposure orders.
Figure 8B:
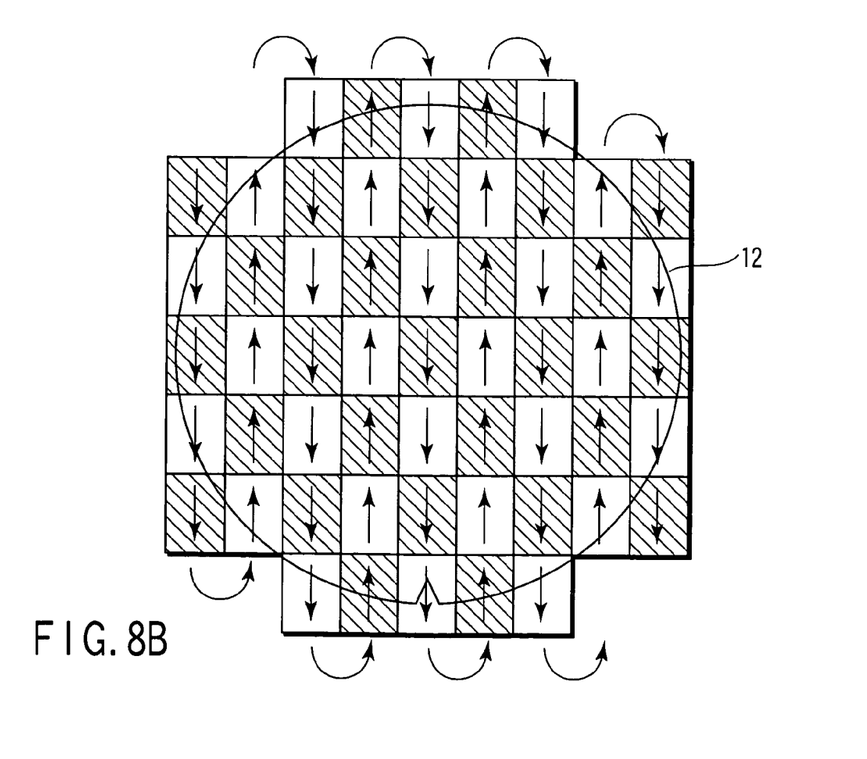

In the above embodiment, the substrate is moved without a change in the direction thereof with respect to projecting exposures onto many exposure fields from one end to the opposed end of the substrate. However, the effect of the above embodiment can be obtained by carrying out projecting exposures onto at least two or more exposure fields without a change in the moving direction of the substrate. Further, in addition to the method in the embodiment in which one region is scanned in one direction, and thereafter, the scanning direction is inverted, and the same region is scanned in the opposite direction, various modifications in the order of exposures may be considered as shown in FIGS. 8A and 8B. Exposure may be carried out in an order as shown in FIG. 8A, and next, exposure may be carried out in an order as shown in FIG. 8B. The hatching regions are regions to be scanning-projected.

Figure 9:
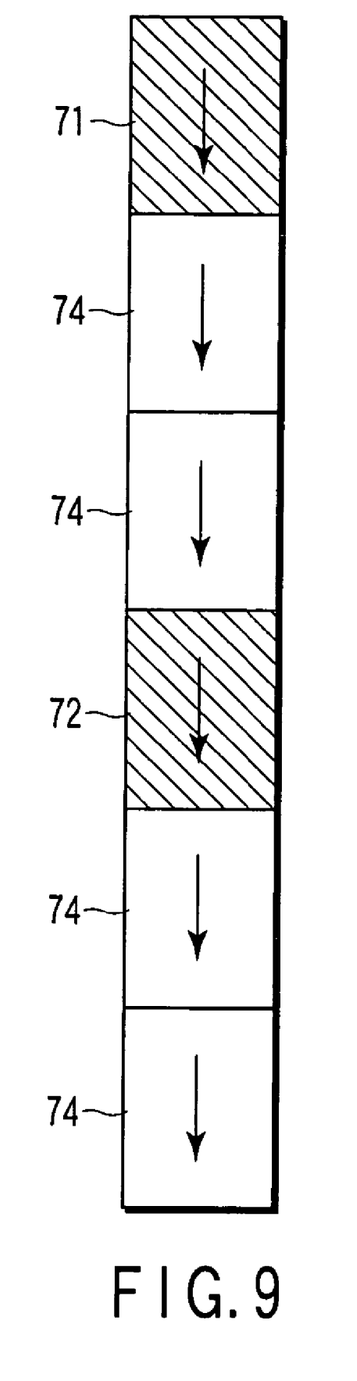
FIG. 9 is a diagram showing another mode of an exposure order.
Figure 10:
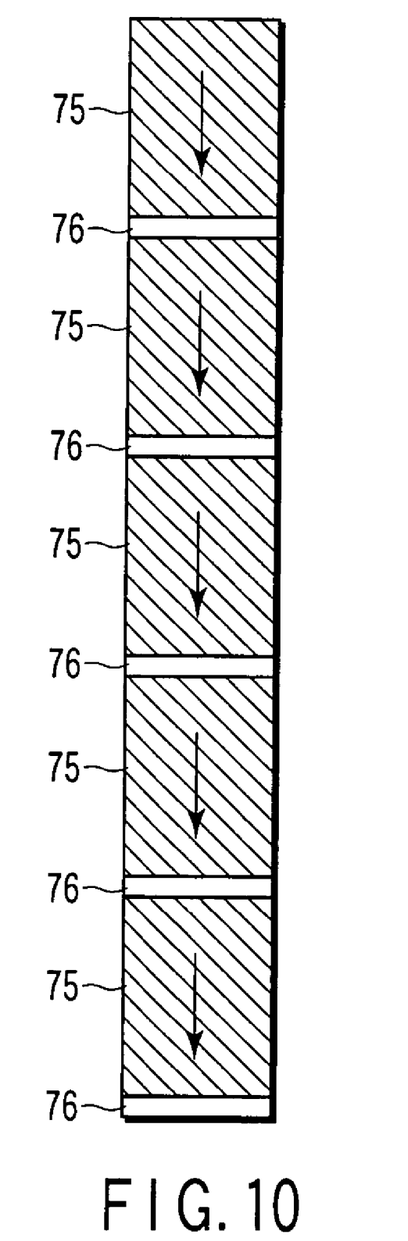
FIG. 10 is a diagram showing yet another mode of an exposure order.

Other scanning procedures are shown in FIGS. 9 and 10. As shown in FIG. 9, when one exposure field 71 is exposed, and thereafter, a following exposure field 72 is exposed without a change in the scanning direction, not only, as in the above-described embodiment, a region of one exposure field is made to be an unexposed region between the regions 71 and 72, but also unexposed regions 74 with an area of two or more exposure fields may be ensured. Namely, during a period from termination of projection of the design patter onto a certain exposure field to start of projection of the design patter onto a following exposure field, the substrate may be moved a distance of substantially integer multiples of a width of the exposure fields in columns.

In addition, as shown in FIG. 10, it is possible to ensure only regions 76 which are narrower than the exposure fields as unexposed regions. A width of the narrow regions 76 is determined dependently on a scanning speed of the substrate at unexposed regions, and a speed at which the photomask after scanning is returned to the original position. In scanning projection shown in FIG. 10, it is necessary for the photomask to return to the original position with respect to a movement speed of the substrate while the regions 76 are passing though under the projection lens. Note that, in FIGS. 9 and 10, the hatching regions 75 are the regions to be scanning-projected without a change in the moving direction of the substrate stage.

MODIFIED EXAMPLE 3

Moreover, as a further modified example, the substrate and the substrate stage are preferably moved from the upstream to the downstream of the flow of the liquid immersion medium fluid. Due to those being moved in this way, the flow of the liquid immersion medium fluid on the substrate is made to be a laminar flow, which can improve a heat exhaust effect. Further, when a photosensitive agent or a dissolution suppression material is provided on the surface of the resist film, the surface can be cleaned before exposure, and exposed regions can be kept clean, which can reduce a dimensional variation caused by a surface segregation of the photosensitive agent or the dissolution suppression material. When the substrate and the substrate stage are, in contrast to the above description, moved from the downstream to the upstream of the liquid immersion medium fluid, the photosensitive agent or the dissolution suppression material dissolved at a stream upper than the exposure region is adhered onto exposed regions and regions to be exposed, and the effect described above cannot be obtained. In order to obtain the effect described above, a speed of the flow of the liquid immersion medium fluid is set such that the photosensitive agent or the dissolution suppression material existing on the surface of the resist film can be sufficiently cleaned and removed before exposure. In order to obtain the effect described above, in accordance with the study by the inventors, assuming that a distance between a substrate having a KrF resist film, an ArF resist film, an $F_2$ resist film or the like formed thereon, a projection lens of the exposure tool is h (mm), and a movement speed of the substrate is $v_s$ (mm/s), a speed $v_l$ of the flow of the liquid immersion medium fluid at a distance h/2 (mm) from the substrate surface is set to be $v_l \geq 2 v_s$.

Furthermore, the speed of the flow of the liquid immersion medium fluid while moving the stage is preferably controlled such that a relative value with the speed of the stage is made constant. Because the laminar flow can be maintained by carrying out such control, the photosensitive agent or dissolution suppression material discharged from the resist film can be smoothly removed from the substrate surface, which can prevent secondary contamination with respect to the substrate surface and the projection lens.

Moreover, at the time of manufacturing a semiconductor device, a semiconductor device having a design pattern projected onto the substrate thereof can be manufactured by using the exposure method described in the above-described embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An exposure method comprising:

forming a resist film on a substrate, the resist film having first and second exposure fields arranged in a column direction;

mounting the substrate on a scanning exposure tool in order to project a design pattern on the first and second exposure fields, the exposure tool comprising:
 an optical pattern image generating unit which generates an optical pattern image corresponding to a part of the design pattern;
 an optical projection unit which projects the optical pattern image onto an exposure slit region on the resist film which is smaller than the first and second exposure fields;
 a substrate stage which moves the substrate; and
 a liquid immersion medium fluid film forming unit which forms a liquid immersion medium fluid film having a flow between a local region on the resist film and the optical projection unit;

forming the liquid immersion medium fluid film by using the liquid immersion medium fluid film forming unit; and projecting the design pattern onto the first or second exposure fields by varying the optical pattern image generated at the optical pattern image generating unit while moving the substrate in a direction parallel to the column direction, wherein:
 the projection of the design pattern onto the first and second exposure fields is continuously carried out without changing a moving direction of the substrate and a direction of the flow of the liquid immersion medium fluid film; and
 the optical pattern image generating unit comprises an optical illumination unit which irradiates an exposure light onto a photomask having the design pattern formed thereon, and a photomask stage which moves the photomask horizontally with respect to an optical axis of the exposure light, the method further comprising:
 returning the photomask to a position at the time of starting the projection of the design pattern onto the first exposure fields in a state in which the optical pattern image is not projected onto the resist film during a period from a termination of the projection of the design pattern onto the first exposure fields to a start of the projection of the design pattern onto the second exposure fields,
 wherein the substrate moves a distance of substantially integer multiples of a width of the first and second exposure fields in the column direction during a period from a termination of the projection of the design pattern onto the first exposure fields to a start of the projection of the design pattern onto the second exposure fields.

2. The exposure method according to claim 1, wherein at least a movement speed of the substrate and a speed of the flow of the liquid immersion medium fluid film is controlled in accordance with a distance which the substrate moves.

3. The exposure method according to claim 1, wherein the liquid immersion medium fluid film has a flow in the column direction of the first and the second exposure fields, and the substrate moves from an upstream toward a downstream of the liquid immersion medium fluid film.

4. The exposure method according to claim 1, wherein a speed of the flow of the liquid immersion medium fluid film is greater than a movement speed of the substrate.

5. A scan-and-step type exposure tool which projects a design pattern onto exposure fields on a resist film, the exposure tool comprising:
   a substrate stage which moves a substrate having a resist film formed thereon, the resist film having first and second exposure fields arranged in a column direction;
   an optical pattern image generating unit which generates an optical pattern image corresponding to a part of the design pattern;
   an optical projection unit which projects the optical pattern image onto an exposure slit region which is smaller than the first and second exposure fields of the resist film;
   a liquid immersion medium fluid film forming unit which forms a liquid immersion medium fluid film having a flow between the exposure slit region on the resist film and the optical projection unit; and
   a control mechanism which controls the substrate stage, the optical pattern image generating unit, and the liquid immersion medium fluid film forming unit in order to control an order of projections of the design pattern onto the first and second exposure fields, a direction of the flow of the liquid immersion medium fluid film, and a moving direction of the substrate, the control mechanism controlling the substrate stage in order to successively project the design pattern onto the first and second exposure fields by successively moving the substrate in a direction parallel to the column direction, and controlling the liquid immersion medium fluid film forming unit in order to maintain the flow of the liquid immersion medium fluid film in a given direction during a period from a start of the projection of the design pattern onto the first exposure fields to a termination of the projection of the design pattern onto the second exposure fields, wherein the control mechanism controls to set, wherein a distance between the substrate having the resist film formed thereon and a projection lens of the optical projection unit is h (mm), and a movement speed of the substrate is $v_s$ (mm/s), a speed $v_1$ of the flow of the liquid immersion medium fluid at a distance h/2 (mm) from the substrate surface so as to be $v_1 \geq 2v_s$.

6. The exposure tool according to claim 5, wherein the exposure tool is an KrF exposure tool having an exposure wavelength of 248 nm, an ArF exposure tool having an exposure wavelength of 193 nm or an $F_2$ exposure tool having an exposure wavelength of 157 nm.

7. A scan-and-step type exposure tool which projects a design pattern onto exposure fields on a resist film, the exposure tool comprising:
   a substrate stage which moves a substrate having a resist film formed thereon, the resist film having first and second exposure fields arranged in a column direction;
   an optical pattern image generating unit which generates an optical pattern image corresponding to a part of the design pattern;
   an optical projection unit which projects the optical pattern image onto an exposure slit region which is smaller than the first and second exposure fields of the resist film;
   a liquid immersion medium fluid film forming unit which forms a liquid immersion medium fluid film having a flow between the exposure slit region on the resist film and the optical projection unit; and
   a control mechanism which controls the substrate stage, the optical pattern image generating unit, and the liquid immersion medium fluid film forming unit in order to control an order of projections of the design pattern onto the first and second exposure fields, a direction of the flow of the liquid immersion medium fluid film, and a moving direction of the substrate, the control mechanism controlling the substrate stage in order to successively project the design pattern onto the first and second exposure fields by successively moving the substrate in a direction parallel to the column direction, and controlling the liquid immersion medium fluid film forming unit in order to maintain the flow of the liquid immersion medium fluid film in a given direction during a period from a start of the projection of the design pattern onto the first exposure fields to a termination of the projection of the design pattern onto the second exposure fields, wherein
   the optical pattern image generating unit comprises an optical illumination unit which irradiates an exposure light onto a photomask having the design pattern formed thereon, and a photomask stage which moves the photomask horizontally with respect to an optical axis of the exposure light, and
   the control mechanism controls the photomask stage and the optical illumination unit in order to return the reticle to a position at a time of starting the projection of the design pattern onto the first exposure fields in a state in which the optical pattern image is not projected onto the resist film during a period from a termination of the projection of the design pattern onto the first exposure fields to a start of the projection of the design pattern onto the second exposure fields,
   wherein the control mechanism controls a movement speed of the substrate such that the substrate is moved a distance of substantially integer multiples of a width of the first and second exposure fields in the column direction during a period from termination of the projection of the design pattern onto the first exposure fields to start of the projection of the design pattern onto the second exposure fields.

8. An exposure method comprising:
   forming a resist film on a substrate, the resist film having first and second exposure fields arranged in a column direction;
   mounting the substrate on a scanning exposure tool in order to project a design pattern on the first and second exposure fields, the exposure tool comprising:
      an optical pattern image generating unit which generates an optical pattern image corresponding to a part of the design pattern;
      an optical projection unit which projects the optical pattern image onto an exposure slit region on the resist film which is smaller than the first and second exposure fields;
      a substrate stage which moves the substrate; and
      a liquid immersion medium fluid film forming unit which forms a liquid immersion medium fluid film having a flow between a local region on the resist film and the optical projection unit;
   forming the liquid immersion medium fluid film by using the liquid immersion medium fluid film forming unit; and
   projecting the design pattern onto the first or second exposure fields by varying the optical pattern image generated at the optical pattern image generating unit while moving the substrate in a direction parallel to the column direction, wherein the projection of the design pattern onto the first and second exposure fields is continuously carried out without changing a moving direction of the substrate and a direction of the flow of the liquid immersion medium fluid film, and the substrate moves a distance of substantially integer multiples of a width of the first and second exposure fields in the column direction during a period from a termination of the projection of the design pattern onto the first exposure fields to a start of the projection of the design pattern onto the second exposure fields.

9. A scan-and-step type exposure tool which projects a design pattern onto exposure fields on a resist film, the exposure tool comprising:

a substrate stage which moves a substrate having formed thereon a resist film having first and second exposure fields arranged in a column direction;

an optical pattern image generating unit which generates an optical pattern image corresponding to a part of the design pattern;

an optical projection unit which projects the optical pattern image onto an exposure slit region which is smaller than the first and second exposure fields of the resist film;

a liquid immersion medium fluid film forming unit which forms a liquid immersion medium fluid film having a flow between the exposure slit region on the resist film and the optical projection unit; and a control mechanism which controls the substrate stage, the optical pattern image generating unit, and the liquid immersion medium fluid film forming unit in order to control an order of projections of the design pattern onto the first and second exposure fields, a direction of the flow of the liquid immersion medium fluid film, and a moving direction of the substrate, the control mechanism controlling the substrate stage in order to successively project the design pattern onto the first and second exposure fields by successively moving the substrate in a direction parallel to the column direction, and controlling the liquid immersion medium fluid film forming unit in order to maintain the flow of the liquid immersion medium fluid film in a given direction during a period from a start of the projection of the design pattern onto the first exposure fields to a termination of the projection of the design pattern onto the second exposure fields, wherein the control mechanism controls a movement speed of the substrate such that the substrate is moved a distance of substantially integer multiples of a width of the first and second exposure fields in the column direction during a period from a termination of the projection of the design pattern onto the first exposure fields to a start of the projection of the design pattern onto the second exposure fields.

* * * * *